(12) United States Patent
Misaizu et al.

(10) Patent No.: US 7,937,822 B2
(45) Date of Patent: May 10, 2011

(54) METHOD FOR CONNECTING TAB PATTERN AND LEAD WIRE

(75) Inventors: Eiji Misaizu, Nagano (JP); Makoto Hiramoto, Nagano (JP)

(73) Assignee: Minebea Co., Ltd., Negano (JP)

( * ) Notice: Subject to any disclaimer, the term of this patent is extended or adjusted under 35 U.S.C. 154(b) by 27 days.

(21) Appl. No.: 12/454,967

(22) Filed: May 27, 2009

(65) Prior Publication Data
US 2009/0300913 A1 Dec. 10, 2009

(30) Foreign Application Priority Data

Jun. 10, 2008 (JP) .................................. 2008-151626

(51) Int. Cl.
*G01R 3/00* (2006.01)
(52) U.S. Cl. ................ 29/595; 29/925; 29/846; 29/847; 73/54.36; 73/54.37; 73/54.38
(58) Field of Classification Search .................... 29/594, 29/825, 846, 847, 595; 73/54.36, 54.37, 73/54.38

See application file for complete search history.

(56) References Cited

U.S. PATENT DOCUMENTS

| 5,090,254 | A | * | 2/1992 | Guckel et al. | 73/862.59 |
| 5,188,983 | A | * | 2/1993 | Guckel et al. | 438/53 |
| 5,280,265 | A | * | 1/1994 | Kramer et al. | 338/210 |
| 5,631,622 | A | * | 5/1997 | Hauber et al. | 338/2 |
| 6,484,567 | B1 | * | 11/2002 | Hajduk et al. | 73/54.37 |
| 6,668,622 | B2 | * | 12/2003 | Hajduk et al. | 73/54.37 |
| 7,047,794 | B2 | * | 5/2006 | Hajduk et al. | 73/54.37 |

FOREIGN PATENT DOCUMENTS

| JP | 05-026607 | 2/1993 |
| JP | B-UM 3040684 | 6/1997 |

* cited by examiner

*Primary Examiner* — C. J Arbes
(74) *Attorney, Agent, or Firm* — Carrier Blackman & Associates, P.C.; Joseph P. Carrier; William D. Blackman

(57) ABSTRACT

A method is for connecting a tab pattern formed on a base sheet and a lead wire, wherein the tab pattern includes: a tab main portion; and a connecting portion formed to continue from one edge line of the tab main portion and to extend from the tab main portion along an extension line that is substantially orthogonal to the edge line, and wherein the method includes: connecting the lead wire on the tab main portion by bonding the lead wire at a position being displaced from the extension line of the connecting portion for more than a given offset amount where the extension line is identical to a center line of the connecting portion, the position being within a given distance from the edge line of the tab main portion.

10 Claims, 5 Drawing Sheets

Horizontal Axis: Cycle Number (the Number of Times)
Vertical Axis: Residual Strain Amount ($\times 10^{-6}$ Strain)

METHOD FOR CONNECTING TAB PATTERN AND LEAD WIRE

CROSS-REFERENCE TO THE RELATED APPLICATION(S)

The present application is based upon and claims priority from prior Japanese Patent Application No. 2008-151626, filed on Jun. 10, 2008, the entire content of which are incorporated herein by reference.

TECHNICAL FIELD

The present invention relates to a method for connecting a tab pattern and a lead wire, which is suitable for connecting the lead wire by soldering to the tab pattern formed on a base sheet.

BACKGROUND

A strain gage of a sheet-type has been conventionally known, in which a strain gage element pattern is formed on a flexible gage base (base sheet). Normally, in this type of strain gage, a tab pattern is formed on the base sheet. The tab pattern has a pair of tab main portions and a pair of connecting portions formed continuously from one edge of the respective tab main portions. The strain gage has a strain gage element pattern, which is formed by a thin conductive strip in a zig-zag pattern of parallel lines, being formed to be connected between the connecting portions. A pair of lead wires for electrically connecting the strain gage to an external device is connected to the tab main portions by soldering.

Since the strain gage is attached to a region of a member, where a strain is caused by an external force, for detecting (measuring) the strain, a mechanical strain (stress) is repeatedly applied to the strain gage itself. Accordingly, a metal fatigue may occur in a short period of time, causing the tab main portion located at an end of the soldered lead wire to have a crack or a disconnection.

There is known a strain gage having a configuration capable of coping with these problems. JP-A-5-026607 discloses an example of such strain gage provided with: a gage base bonded onto an object to be measured; a strain-sensitive resistor; and gage leads, and an elastic member is interposed between the strain gage and a terminal, and the gage leads are attached onto the elastic member in a bent state.

Another example of strain gage, disclosed in JP-B-UM-3040684, is configured to have: a narrow gage element pattern portion which is made of a resistive material and detects a strain to indicate a resistance change responsive to this strain; at least one pair of wide gage tab pattern portions to which gage leads are connected; and at least one pair of connection pattern portions for electrically connecting these gage tab pattern portions to respective ends of the gage element pattern portion, in which the gage element pattern portion, the pair of gage tab pattern portions, and the pair of connection pattern portions are bonded onto a gage base made of a flexible insulating material, wherein slits for distributing stress concentration to prevent disconnections are formed at regions of the gage tab pattern portions, which are connected to the connection pattern portions.

However, the above-described conventional strain gages and a method for connecting tab patterns and lead wires have the following problems.

Firstly, a path from the gage element pattern portion to the lead wires tends to be long because the gage lead, which is bent to have some margins, is added in the configuration disclosed in the publication JP-A-5-026607, and a U-shaped path is added in the configuration disclosed in the publication JP-B-UM-3040684. Accordingly, the addition of such paths causes not only an increase in complexity of geometric structure of a pattern and in size of the entire strain gage, but also an increase in the overall cost due to designing the strain gage with a new pattern.

Secondly, the above-described conventional strain gages are disadvantageous in terms of electrical performance because of those additional paths. To be more specific, since the conductive path other than the gage element pattern portion becomes long, an electrical resistance is deteriorated, which contributes to a reduction in the efficiency of signal transmission associated with electric loss increase and degradation in S/N characteristics, and which is also likely to become a cause of error with respect to a normal signal obtained from the gage element pattern portion.

SUMMARY

One of objects of the present invention is to provide a method for connecting tab patterns and lead wires by a simple configuration and improved reliability.

According to an aspect of the present invention, there is provided the method for connecting a tab pattern $3t$ formed on a base sheet 2 and a lead wire 4, wherein the tab pattern $3t$ includes: a tab main portion $3tm$; and a connecting portion $3tc$ formed to continue from one edge line $3tms$ of the tab main portion $3tm$ and to extend from the tab main portion $3tm$ along an extension line Fs that is substantially orthogonal to the edge line, and wherein the method includes: connecting the lead wire 4 on the tab main portion $3tm$ by bonding the lead wire 4 at a position being displaced from the extension line Fs of the connecting portion $3tc$ for more than a given offset amount Lx, where the extension line Fs is identical to a center line of the connecting portion $3tc$, the position being within a given distance Ly from the edge line of the tab main portion $3tm$.

According to this aspect, each tab pattern $3t$ may be provided so that the tab main portion $3tm$ can be formed into a substantially rectangular shape, and that the connecting portion $3tc$ can be formed continuously from an end (corner) of the edge line of the tab main portion $3tm$ at one side of said one edge $3tms$ thereof. The strain gage 1 may be configured to have a strain gage element pattern $3g$ formed on the other region of the base sheet 2, and by forming this gage element pattern $3g$ continuously with the connecting portions $3tc$. As the lead 4, an external connection lead wire $4c$ derived from the tab pattern $3t$ may be applied, or a terminal lead $4s$ of an electronic component 100 mounted on the base sheet 2 may be applied.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION

Figure 1:
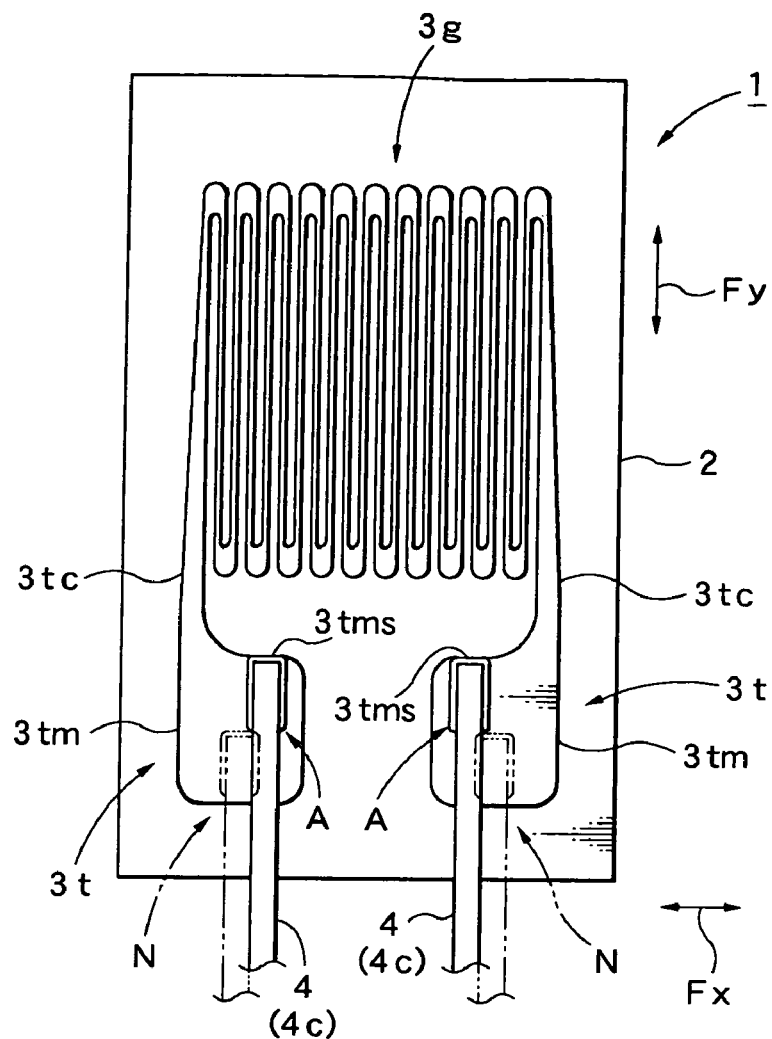
FIG. 1 is a schematic plan view of a strain gage in which connections are made by a method according to an embodiment of the present invention.

Embodiments according to the present invention will be described in detail with reference to the accompanying drawings. The scope of the claimed invention should not be limited to the examples illustrated in the drawings and those described below.

Figure 2:
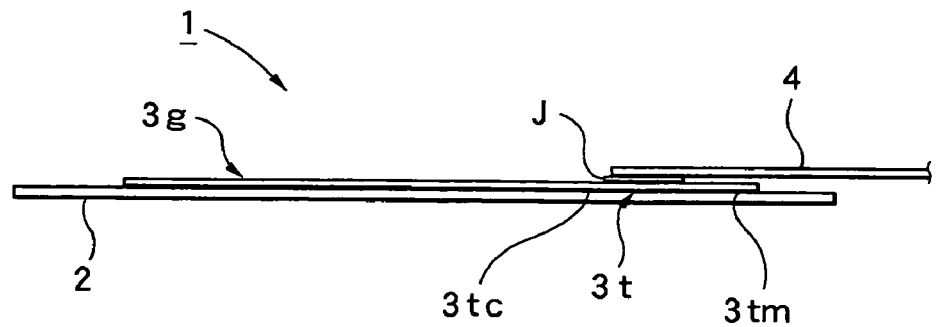
FIG. 2 is a side view of the strain gage.

An overview of a strain gage 1, on which a method for connecting tab patterns and lead wires according to the embodiment is applied, will be described with reference to FIGS. 1 and 2.

The strain gage 1 has a base sheet (gage base) 2 that is formed as a flexible sheet by using an insulating material such as a polyimide resin or the like. On the base sheet 2, a gage element pattern 3g and a pair of tab patterns 3t, 3t are formed. The gage element pattern 3g and the tab patterns 3t, 3t are formed by, for example, performing a photo-etching process on copper nickel alloy foil provided on a surface of the base sheet 2. Accordingly, the gage element pattern 3g and the tab patterns 3t, 3t are formed as a continuous circuit pattern. The pair of the tab patterns 3t, 3t is disposed at one side of the base sheet 2 in a longitudinal direction, and is formed symmetrically.

Each of the tab patterns 3t has: a substantially rectangular tab main portion 3tm; and a connecting portion 3tc formed continuously from an edge of the tab main portion 3tm at one side of one edge 3tms thereof in the longitudinal direction of the base sheet 2.

The gage element pattern 3g is disposed at the other side of the base sheet 2 in the longitudinal direction, and is formed by a thin conductive strip in a zig-zag pattern of parallel lines extending along the longitudinal direction of the base sheet 2. One end of the gage element pattern 3g is formed so as to be continuous with the connecting portion 3tc of one tab pattern 3t, while the other end of the gage element pattern 3g is formed so as to be continuous with the connecting portion 3tc of the other tab pattern 3t. In other words, the gage element pattern 3g is formed to be connected between the connecting portions 3tc.

According to the configuration, in which the tab main portion 3tm of each tab pattern 3t is formed into a rectangular shape, and the connecting portion 3tc is formed continuously from the end of this tab main portion 3tm at one side of one edge 3tms thereof as described above, the connection method according to the embodiment can be more desirably applied. Accordingly, the simplification of a geometric structure and reduction in the overall size and cost are realized, and in addition, greater advantages can be expected in avoiding electric performance degradation.

The tab main portions 3tm, 3tm are respectively connected with lead wires 4c, 4c (simply referred to as "leads 4") by soldering for establishing an electrical connection with an external device. The strain gage 1 illustrated in FIGS. 1 and 2 is configured as described above.

When using the strain gage 1, the back side of the base sheet 2 is applied to an object to be measured. When a stain is caused in the object to be measured, the strain (stress) acts on the gage element pattern 3g; therefore, the resistance value of the gage element pattern 3g is changed, and a strain amount can be measured based on this resistance value change.

As mentioned above, a pair of the lead wires 4c, 4c is connected to the tab main portions 3tm, 3tm by soldering; therefore, when used for a long time, this type of strain gage may cause a problem that a crack and a disconnection occur in regions of the tab main portions 3tm, 3tm, which are located at the ends of the soldered lead wires 4c, 4c, because the entire strain gage 1 is repeatedly subjected to strains such as tension, compression and bending contraction. For this reason, the method for connecting tab patterns and lead wires according to the present embodiment is suitable to be used at the time of connecting the lead wires 4c, 4c to the respective tab main portions 3tm, 3tm.

Next, the connection method for connecting tab patterns and lead wires according to the present embodiment will be described with reference to FIGS. 1 to 7.

First, a basic concept of the connection method according to the embodiment will be described. In the connection method according to the embodiment, an approach is made in terms of whether or not there is a significant difference for avoiding a pattern disconnection due to a connection position in the tab main portion 3tm when the lead wire 4c is connected to the tab main portion 3tm of the tab pattern 3t. Further, as a result of conducting this verification, it has become apparent that there exists superiority for avoiding a pattern disconnection due to a connection position to be selected as described below, and the connection method according to the embodiment has been devised based on this positional superiority.

Figure 3A:
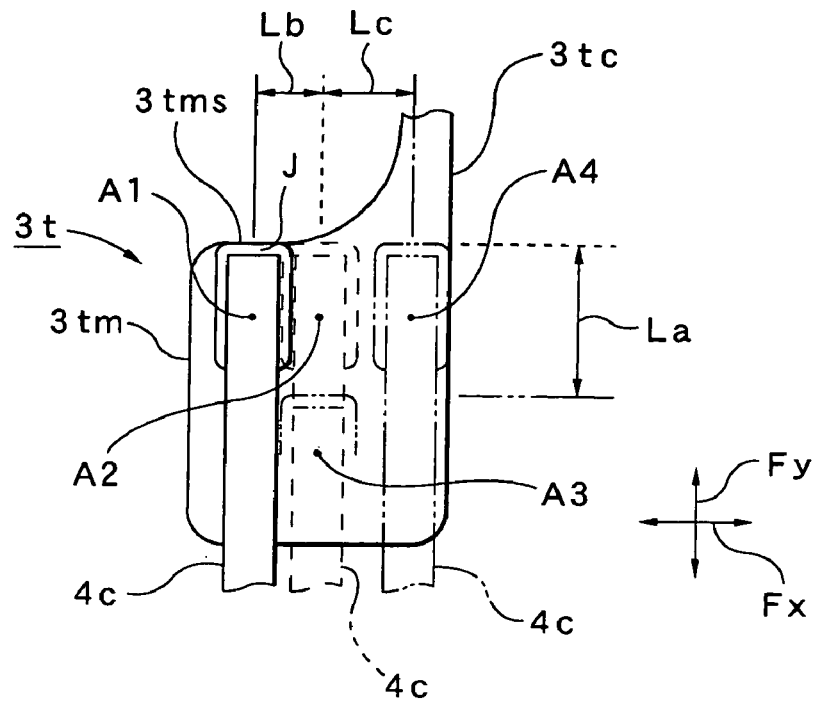
FIG. 3A is an explanatory diagram illustrating a plurality of different connection positions with tab patterns in the strain gage.
Figure 3B:
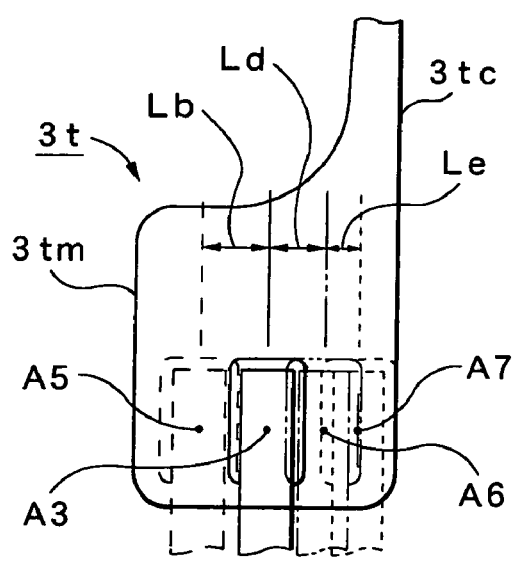
FIG. 3B is an explanatory diagram illustrating a plurality of different connection positions with the tab patterns in the strain gage.
Figure 3C:
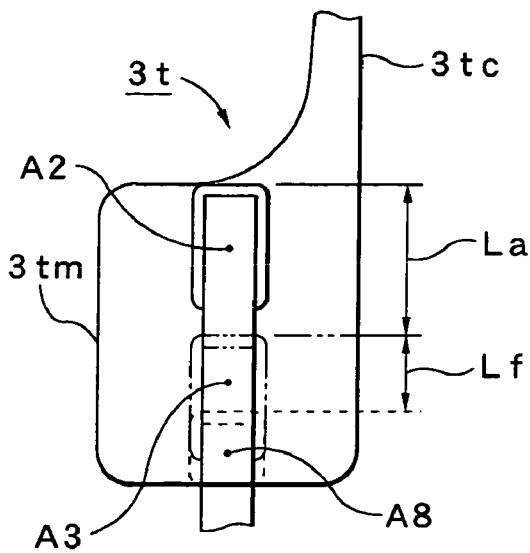
FIG. 3C is an explanatory diagram illustrating a plurality of different connection positions with the tab patterns in the strain gage.

FIGS. 3A-3C illustrate eight selected different connection positions A1-A8. It should be noted that in FIGS. 3A-3C, a direction indicated by an arrow Fy (Fy direction) indicates the longitudinal direction of the connecting portion 3tc, and the Fy direction coincides with the direction of an extension line Fs of the connecting portion 3tc, where the extension line Fs is identical to a center line of the connecting portion 3tc. Further, a direction indicated by an arrow Fx (Fx direction) indicates the direction perpendicular to the Fy direction. FIG. 3A illustrates the connection positions A1-A4. The connection position A3 serves as a standard connection position at which a connection-side tip of the lead wire 4c is located approximately at the center of the tab main portion 3tm.

Accordingly, the other connection positions A1, A2 and A4 each serves as a position displaced by a given width La from the connection position A3 in the Fy direction in which the connecting portion 3*tc* exists. In the illustrated case, one edge 3*tms* of the tab main portion 3*tm* is allowed to approximately coincide with the tip position of the lead wire 4*c* (including a connection part J provided by soldering) Among the respective connection positions A1, A2 and A4, the connection position A2 serves as a position displaced directly in the Fy direction from the connection position A3. The connection position A1 serves as a position displaced along one edge 3*tms* from this connection position A2 by a given width Lb in the Fx direction opposite to the direction in which the connecting portion 3*tc* exists. The connection position A4 serves as a position displaced along one edge 3*tms* from the connection position A2 by a given width Lc in the Fx direction in which the connecting portion 3*tc* exists.

FIG. 3B illustrates the connection positions A5-A7. The respective connection positions A5-A7 each serves as a position directly displaced laterally in the Fx direction from the connection position A3. Among the respective connection positions A5-A7, the connection position A5 serves as a position displaced by the given width Lb in the Fx direction opposite to the direction in which the connecting portion 3*tc* exists. The connection position A6 serves as a position displaced by a given width Ld in the Fx direction in which the connecting portion 3*tc* exists. The connection position A7 serves as a position further displaced from the connection position A6 by a given width Le in the Fx direction in which the connecting portion 3*tc* exists. Accordingly, the connection positions A5 and A7 are located in the vicinity of both ends in the Fx direction in the tab main portion 3*tm*, while the connection position A6 is located at substantially the midpoint between the connection positions A3 and A7.

FIG. 3C illustrates the connection position A8 and the above-mentioned connection position A2. The connection positions A8 and A2 each serves as a position directly displaced in the Fy direction from the connection position A3. In this case, the connection position A8 serves as a position displaced by a given width Lf in the Fy direction opposite to the direction in which the connecting portion 3*tc* exists. As mentioned above, the connection position A2 serves as a position displaced by the given width La from the connection position A3 in the Fy direction in which the connecting portion 3*tc* exists.

Samples, to which each of the selected connection positions A1 to A8 is applied, are manufactured in groups of six (partly in groups of four), and a fatigue life test is performed on each sample in accordance with National Aerospace Standards 942 (NAS942). Specifically, a residual strain amount is measured for each of given cycle numbers (the numbers of times) when an alternate load is applied at 30 Hz, and ±1500× $10^6$ strain. FIGS. 4A-4H show measurement results of residual strain amounts when the cycle number of each sample is $10^6$ times, $2 \times 10^6$ times, $5 \times 10^6$ times and $10 \times 10^6$ times. It should be noted that conversions of the residual strain amounts are performed based on resistance value changes ΔR of the strain gage prior to and subsequent to the application of the alternate load using a given conversion formula, i.e., the following conversion formula: strain amount $\epsilon = \Delta R/(k \cdot R)$, where R represents a resistance value of the strain gage, and k represents a gage factor (=2.0). Furthermore, according to the fatigue life test results, the fatigue life is determined when the residual strain amount is $100 \times 10^{-6}$ or more based on the NAS standards.

Figure 4A:
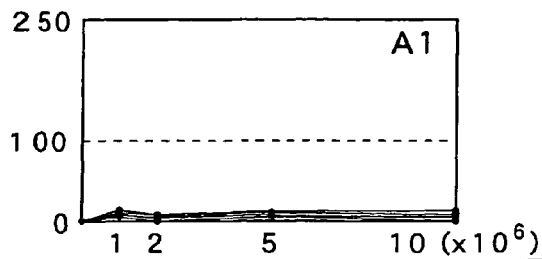
FIG. 4A is a data diagram showing fatigue life test results associated with the corresponding connection position.
Figure 4B:
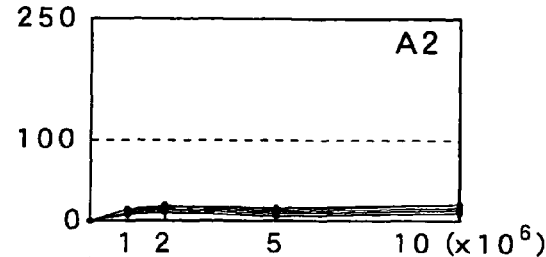
FIG. 4B is a data diagram showing fatigue life test results associated with the corresponding connection position.
Figure 4C:
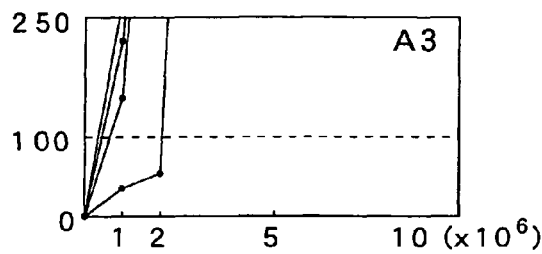
FIG. 4C is a data diagram showing fatigue life test results associated with the corresponding connection position.
Figure 4D:
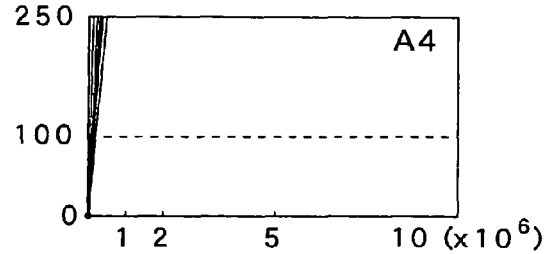
FIG. 4D is a data diagram showing fatigue life test results associated with the corresponding connection position.
Figure 4E:
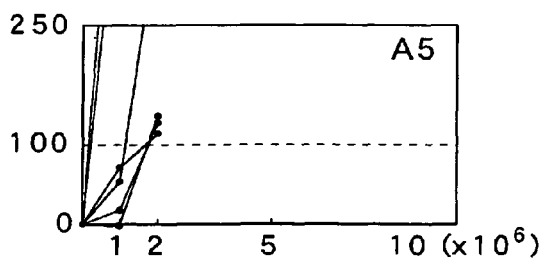
FIG. 4E is a data diagram showing fatigue life test results associated with the corresponding connection position.
Figure 4F:
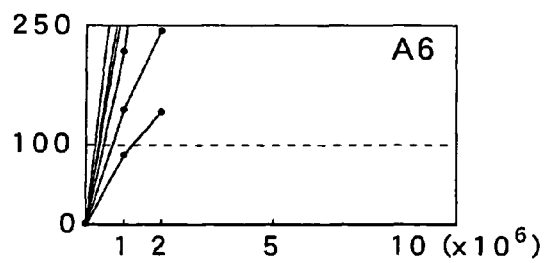
FIG. 4F is a data diagram showing fatigue life test results associated with the corresponding connection position.
Figure 4G:
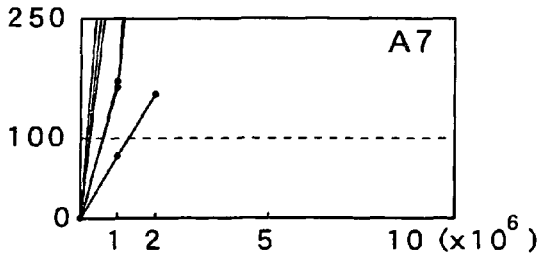
FIG. 4G is a data diagram showing fatigue life test results associated with the corresponding connection position.
Figure 4H:
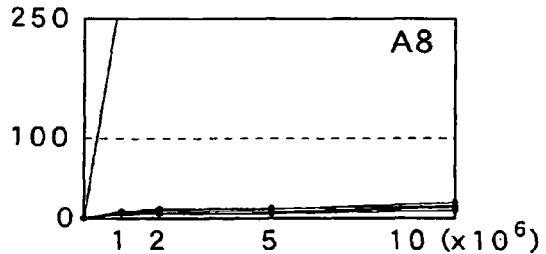
FIG. 4H is a data diagram showing fatigue life test results associated with the corresponding connection position.

The following results are obtained from the fatigue life test. FIG. 4A shows the results associated with the connection position A1 illustrated in FIG. 3A. In this case, no sample has reached the fatigue life among the six samples. FIG. 4B shows the results associated with the connection position A2 illustrated in FIG. 3A. In this case, no sample has reached the fatigue life among the six samples. FIG. 4C shows the results associated with the connection position A3 illustrated in FIG. 3A. In this case, all the samples have reached the fatigue life among the four samples. FIG. 4D shows the results associated with the connection position A4 illustrated in FIG. 3A. In this case, all the samples have reached the fatigue life among the six samples. FIG. 4E shows the results associated with the connection position A5 illustrated in FIG. 3B. In this case, all the samples have reached the fatigue life among the six samples. FIG. 4F shows the results associated with the connection position A6 illustrated in FIG. 3B. In this case, all the samples have reached the fatigue life among the six samples. FIG. 4G shows the results associated with the connection position A7 illustrated in FIG. 3B. In this case, all the samples have reached the fatigue life among the six samples. FIG. 4H shows the results associated with the connection position A8 illustrated in FIG. 3C. In this case, one of the samples has reached the fatigue life among the six samples.

Figure 5:
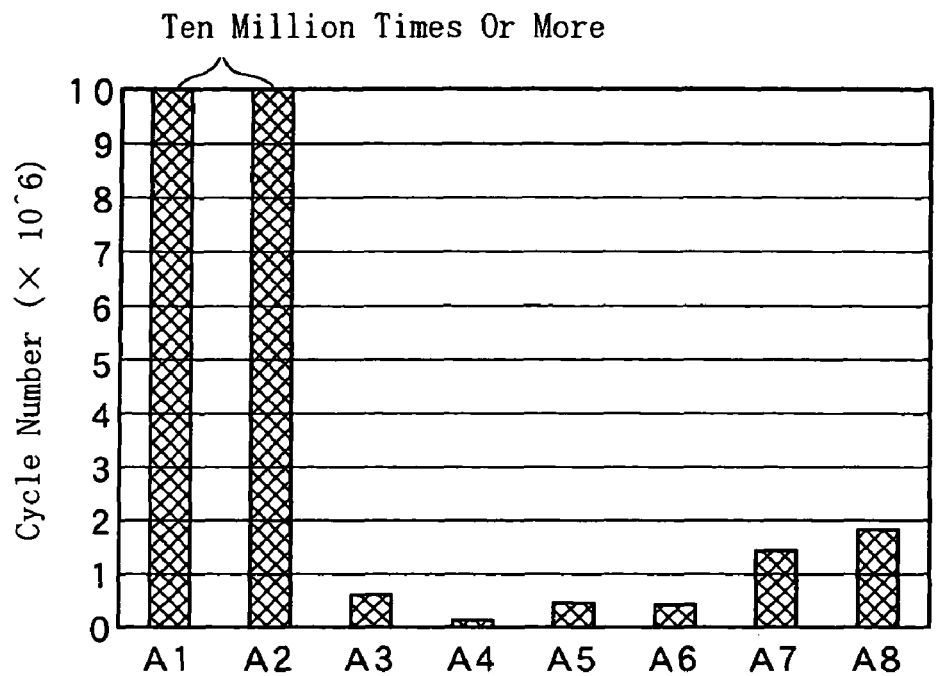
FIG. 5 is a data diagram provided as a bar graph showing average values of cycle numbers, which reach the fatigue life, for the connection positions.

As is evident from these fatigue life test results, for the connection positions A1-A8 of the lead wire 4*c* to the tab main portion 3*tm*, there is a clear significant difference for avoiding a pattern disconnection in accordance with the positions. In other words, if at least the connection position A1 or A2 is selected, a pattern disconnection can be effectively avoided, whereas if the connection position A3, A4, A5, A6, A7 or A8 is selected, the possibility of occurrence of a pattern disconnection is increased. FIG. 5 shows average values of cycle numbers that reach the fatigue life for the respective connection positions A1-A8, and it can be seen that the superiority of the connection positions A1 and A2 is outstanding.

Figure 6:
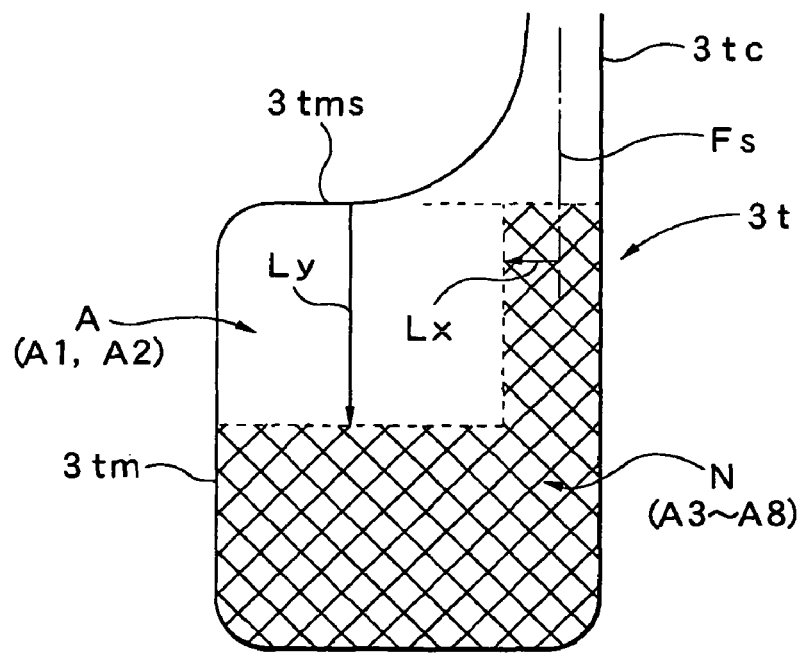
FIG. 6 is an explanatory diagram illustrating fatigue life test results for the connection positions.

With consideration given to these verification results, in the connection method according to the present embodiment, an area, which includes the above-described connection position A1 and/or connection position A2 and does not include the connection positions A3-A8, is selected as a connection position when the lead wires 4*c* are connected to the tab main portions 3*tm* formed on the base sheet 2. FIG. 6 represents the areas of the connection positions selectable based on these verification results. In FIG. 6, a white area A serves as an area which includes the connection positions A1 and A2 and at which the possibility of avoiding a pattern disconnection is high, while a grid pattern area N serves as an area which includes the connection positions A3-A8 and at which the possibility of occurrence of a pattern disconnection is high.

Accordingly, with consideration given to FIG. 6, the white area A, i.e., the connection position at which the possibility of avoiding a pattern disconnection is high, can be selected by selecting a position on the tab main portion 3*tm*, which satisfies both of a first positional condition that requires the position to be displaced by a given width Lx or more with respect to the extension line Fs of the connecting portion 3*tc* where the extension line Fs is identical to a center line of the connecting portion 3*tc*, and a second positional condition that requires the position to be located within a given width Ly with respect to one edge 3*tms*. And in the connection method according to the present embodiment, the lead wire 4*c* is soldered to the selected connection position on the tab main portion 3*tm*. It should be noted that the concept of the soldering also includes welding and the like.

Figure 7:
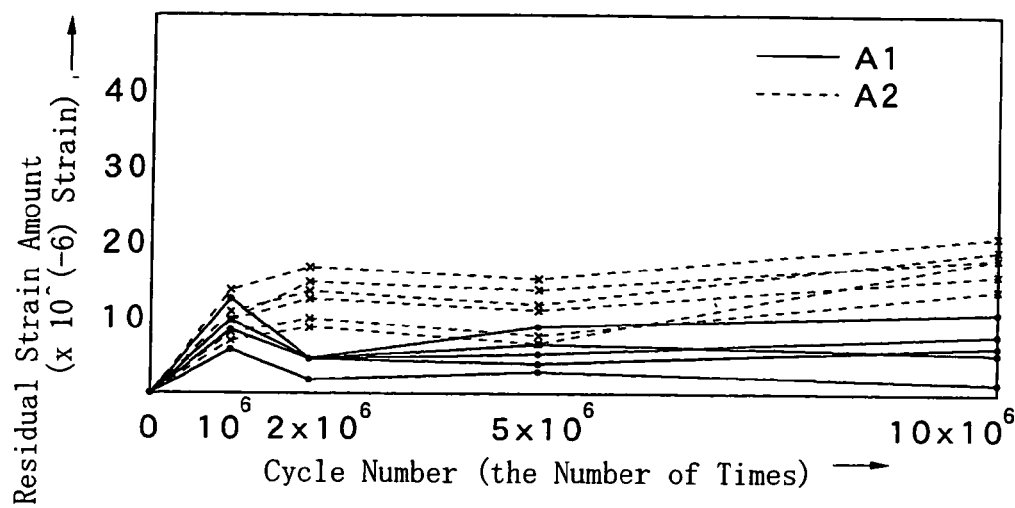
FIG. 7 is a data diagram showing part of the fatigue life test results associated with the connection positions, which is provided in an enlarged range.

Moreover, as shown in FIG. 7, there is a difference in superiority level even between the connection positions A1 and A2, and FIG. 7 shows results indicating that the superiority of the connection position A1 is higher than that of the connection position A2. Accordingly, the connection position A1 is the optimum connection position, which comes to a conclusion that an effective connection position at which a pattern disconnection is avoidable exists in a given area with this connection position A1 centered. FIG. 1 illustrates a state in which the lead wires 4c, 4c are connected to the connection positions A1 in the areas A. Further, for comparison purposes, a state in which the lead wires 4c, 4c are connected to the connection positions A3 in the areas N is indicated by phantom lines.

Hence, in the connection method according to the present embodiment as described above, the lead wires 4c (leads 4) are each soldered to the position on the tab main portion 3tm, which satisfies both of the first positional condition that requires the position to be displaced by the given width Lx or more with respect to the extension line Fs of each of the connecting portions 3tc where the extension line Fs is identical to a center line of the connecting portion 3tc, and the second positional condition that requires the position to be located within the given width Ly from each of one edges 3tms; therefore, the need for an additional path as conventional measures against disconnections is eliminated. Accordingly, the simplification of a geometric structure of a pattern, etc. and the reduction in the overall size can be realized, and in addition, the need for a new pattern design, etc. is eliminated, thus also making it possible to contribute to the reduction in the overall cost. Furthermore, since the need for an additional path as conventional measures against disconnections is eliminated, it is possible to avoid the problem that the electrical resistance value is unnecessarily increased. Accordingly, it is possible to avoid problems that cause electric performance degradation, including problems such as a reduction in the efficiency of signal transmission associated with electric loss increase, degradation in S/N characteristic, and a cause of error with respect to a normal signal.

In particular, since the connection method according to the present invention is applied to the strain gage 1 provided by forming the strain gage element pattern 3g on the other region of the base sheet 2, and by forming this gage element pattern 3g continuously with the connecting portions 3tc, the connection method according to the present invention can be utilized as the optimum connection method for the strain gage 1. Accordingly, the connection method according to the present invention is capable of avoiding the occurrence of a crack and a disconnection in the strain gage 1, and is also capable of contributing to the improvement in the reliability of the strain gage 1.

Although the embodiment has been described in detail thus far, the present invention will not be limited to the configuration described above, but any modification, addition, and/or deletion may be made in details of structure, shape, material, quantity, numerical value, technique, or procedure without departing from the scope of the present invention.

Figure 8:
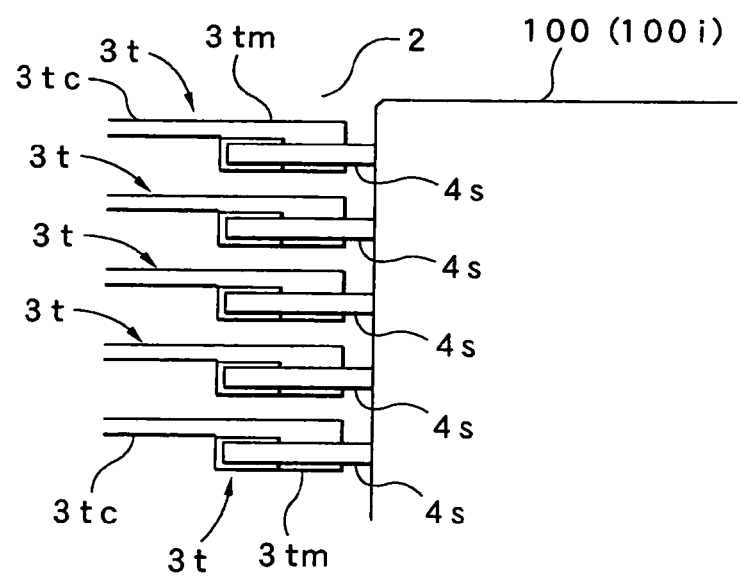
FIG. 8 is an explanatory diagram illustrating a case where the connection method according to the embodiment is applied to terminal leads of an electronic component.

For example, although copper nickel alloy foil is provided as an example of a material for the gage element pattern 3g and the tab patterns 3t, 3t, the present invention does not exclude the application of other resistive materials. Further, although the case of forming the base sheet 2 as a flexible sheet is provided as an example, a PCB (printed circuit board) having no flexibility may alternatively be used. On the other hand, in the embodiment illustrated in FIGS. 1-7 described above, the external connection lead wire 4c derived from the tab pattern 3t is provided as an example of the lead 4; however, as illustrated in FIG. 8, the connection method according to the present invention may also be applied to terminal leads 4s of an electronic component 100, e.g., an IC chip 100i, mounted on the base sheet 2 as alternatives to the leads 4. Even in this case, the connection method according to the present invention can be carried out similarly to the embodiment illustrated in FIGS. 1-7 only by replacing the lead wires 4c with the terminal leads 4s. It should be noted that the connection method according to the present invention may also be similarly applied to various electronic components, such as a resistor, a capacitor, a coil, and a connector, as alternatives to the electronic component 100. Thus, the connection method according to the present invention has excellent versatility, and can be widely utilized as a method for connecting the tab patterns 3t and the leads 4 for various application purposes.

As described with reference to the embodiments, there is provided a method for connecting tab patterns and lead wires, which has the following remarkable advantages.

(1) The leads 4 are each soldered to the position on the tab main portions 3tm, which satisfies both of the first positional condition that requires the position to be displaced by the given width Lx or more with respect to the extension line Fs of each of the connecting portions 3tc where the extension line Fs is identical to a center line of the connecting portion 3tc, and the second positional condition that requires the position to be located within the given width Ly from each of one edges 3tms; therefore, the need for an additional path as conventional measures against disconnections is eliminated. Accordingly, the simplification of a geometric structure of a pattern, etc. and the reduction in the overall size can be realized, and in addition, the need for a new pattern design, etc. is eliminated, thus also making it possible to contribute to the reduction in the overall cost.

(2) Since the need for an additional path as conventional measures against disconnections is eliminated, it is possible to avoid the problem that the electrical resistance value is unnecessarily increased. Accordingly, it is possible to avoid problems that cause electric performance degradation, including problems such as a reduction in the efficiency of signal transmission associated with electric loss increase, degradation in S/N characteristic, and a cause of error with respect to a normal signal.

(3) In a preferred aspect, if the tab main portion 3tm of each tab pattern 3t is formed into a substantially rectangular shape, and the connecting portion 3tc is formed continuously from the end of this tab main portion 3tm at one side of one edge 3tms thereof, the connection method according to the present invention can be carried out in a more desirable aspect. Accordingly, the simplification of a geometric structure, reduction in the overall size and cost are realized, and in addition, greater operating effects can be expected in avoiding electric performance degradation.

(4) In a preferred aspect, if the connection method according to the present invention is applied to the strain gage 1 provided by forming the strain gage element pattern 3g on the other region of the base sheet 2, and by forming this gage element pattern 3g continuously with the connecting portions 3tc, the connection method according to the present invention can be utilized as the optimum connection method for the strain gage 1. Accordingly, the connection method according to the present invention is capable of avoiding the occurrence of a crack and a disconnection in the strain gage 1, and is also capable of contributing to the improvement in the reliability of the strain gage 1.

(5) In a preferred aspect, the connection method according to the present invention has excellent versatility because the connection method can be widely utilized for various application purposes, including the application of the connection method to the connection of the external connection lead wire 4c derived from the tab pattern 3t, or the connection of the terminal lead 4s of the electronic component 100 mounted on the base sheet 2.

It is to be understood that the present invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from all components shown in the embodiments. Further, the components in different embodiments may be used appropriately in combination.

What is claimed is:

1. A method for connecting a tab pattern formed on a base sheet and a lead wire,
   wherein the tab pattern comprises:
   a tab main portion; and
   a connecting portion formed to continue from one edge line of the tab main portion and to extend from the tab main portion along an extension line that is substantially orthogonal to the edge line, and wherein the method comprises:
   connecting the lead wire on the tab main portion by bonding the lead wire at a position that is displaced from the extension line of the connecting portion by more than a given offset amount where the extension line is identical to a center line of the connecting portion, the position also abutting the edge line of the tab main portion.

2. The method according to claim 1, wherein the tab main portion is formed to have a substantially rectangular shape, and wherein the connecting portion is continuously formed from an edge of one side of the edge line of the tab main portion.

3. The method according to claim 1, wherein the base sheet is formed with a strain gage element pattern being formed continuously to the connecting portion of the tab pattern to function as a strain gage.

4. The method according to claim 1, wherein the lead wire is configured to provide electrical connection between the tab pattern and an external device.

5. The method according to claim 1, wherein the lead wire is a terminal lead of an electronic component mounted on the base sheet.

6. The method according to claim 3, wherein the strain gage element includes a thin conductive strip arranged in a zig-zag pattern of parallel lines, and an outer one of the parallel lines extends continuously from the tab pattern connecting portion.

7. The method according to claim 1, wherein the lead wire extends substantially parallel to the extension line.

8. The method according to claim 1, wherein the position is displaced inwardly relative to the base sheet by more than the given offset amount from the extension line.

9. The method according to claim 1, wherein the lead wire is connected on the tab main portion such that the lead wire covers less than half of the tab main portion.

10. The method according to claim 1, wherein the lead wire is connected on the tab main portion by soldering.

* * * * *